United States Patent [19]

Granz et al.

[11] Patent Number: 4,755,708

[45] Date of Patent: Jul. 5, 1988

[54] HYDROPHONE

[75] Inventors: Bernd Granz, Oberasbach; Bertram Sachs, Erlangen, both of Fed. Rep. of Germany

[73] Assignee: Siemens Aktiengesellschaft, Berlin and Munich, Fed. Rep. of Germany

[21] Appl. No.: 737,319

[22] Filed: May 23, 1985

[30] Foreign Application Priority Data

May 30, 1984 [DE] Fed. Rep. of Germany ....... 3420273

[51] Int. Cl.[4] .............................................. H01L 41/08

[52] U.S. Cl. .................................... 310/337; 310/334; 310/800; 310/327; 367/157

[58] Field of Search ................................ 310/334–337, 310/327, 348, 800; 367/157

[56] References Cited

U.S. PATENT DOCUMENTS

| | | | |
|---|---|---|---|
| 4,409,510 | 10/1983 | Assenza et al. | 310/334 |
| 4,424,465 | 1/1984 | Ohigashi et al. | 310/800 X |
| 4,443,730 | 4/1984 | Kitamura et al. | 310/800 X |
| 4,473,769 | 9/1984 | Nguyen | 310/800 X |
| 4,517,665 | 5/1985 | De Reggi et al. | 310/800 X |
| 4,555,953 | 12/1985 | Dario et al. | 310/800 X |

FOREIGN PATENT DOCUMENTS

| | | |
|---|---|---|
| 3149732 | 12/1981 | Fed. Rep. of Germany . |
| 3246661 | 12/1982 | Fed. Rep. of Germany . |

OTHER PUBLICATIONS

*Monolithic Silicon-PVF$_2$ Piezoelectric Arrays for Ultrasonic Imaging* by R. G. Swartz et al., Stanford Electronics Laboratories, Stanford, Calif., 94305, presented at the 8th International Symposium on Acoustic Imaging, Key Biscayne, Fla., May 29–Jun. 2, 1978, 26 pages.

Y"Miniature Piezoelectric Polymer Ultrasonic Hydrophone Probes", *Ultrasonics*, P. A. Lewis, Sep. 1981, pp. 213–216.

J. Accoust. Soc. Am., vol. 61, Suppl. No. 1, Spring 1977, pp. 17 and 18.

*Primary Examiner*—Mark O. Budd

*Attorney, Agent, or Firm*—Adel A. Ahmed; Thomas H. Jackson

[57] ABSTRACT

A miniature hydrophone is disclosed which contains a piezoelectric foil as a base element (2) with a linear arrangement of multiplicity of detector elements (10). In accordance with the invention, the electrodes (5) are arranged on a top surface (15) of one of the flat sides of a support (16) and are capacitively coupled by a bonding layer (6) to the base element (2). The detector elements (10) are associated with an amplifier (32) which, with equal length connecting leads (11, 26 and/or 12, 27), is fastened to a side face of the support (16). The electrical interconnection between the detector element (10) and the associated amplifier (32) employs a groove (24) through the corners of support 16. Additional such modules can form an assembly unit in a row arrangement of a size equal to that of the detector elements (10). Since all the connections (11, 26, 12, 27) to the amplifiers (32, 36) are very short and of equal length, the sensitivity of a system arrangement of such detector elements (10) and amplifiers (32 and/or 36) is homogeneous and very high.

10 Claims, 2 Drawing Sheets

HYDROPHONE

BACKGROUND OF THE INVENTION

1. Technical Field

The invention relates to the field of hydrophones and, in particular, to a hydrophone comprising a flat piezoelectric base element which holds a linear arrangement of detector elements having piezoelectrically active areas to which are attached on both sides respectively a pattern of metalic electrodes and connecting electrical conductors, the electrically active area of the base element being polarized in the direction of the thickness of the foil and having only a small localized area in planar contact with the base element.

2. Description of the Prior Art

Miniature hydrophones are known which serve for the measurement of ultrasonic fields within a sound conducting medium. For a base element one may employ a membrane of polyvinylidene fluoride PVDF or co-polymers of vinylidene fluoride with tetrafluorethylene or with trifluorethylene with a thickness, for example, of 25 $\mu$m, which is stretched as a membrane between two rings of metal. The piezoelectrically active area is located at its mid-point which is provided with electrodes and this forms a detector element. The foil can furthermore be stretched at the end of a coaxial cable and its piezoelectrically active area, with a spread of about 1 mm, arranged at the point of a needle. With this needle design, one obtains a sensitivity of about $6.3\times10^{-8}$ V/Pa ("Miniature Piezoelectric Polymer Ultrasonic Hydrophone Probes", P.A. Lewis, *Ultrasonics,* September 1981, pps. 213 to 216). The detection of ultrasonic fields with greater range with this type of detection containing but a single detector element, however, requires the expenditure of relatively long times.

An attempt has been made to provide foils of polyvinylidene fluoride PVDF. These foils have a linear arrangement of a large number of piezoelectrically active areas, each area being provided with a pattern of electrodes and connecting conductors generally made of metal. These areas are formed on both sides of the foil by evaporation. The detector elements have a diameter of about 2 mm and their capacity is about 8 pf. An amplifier is located at the end of a 30 cm long cable. With this arrangement one obtains a sensitivity of about $3.2\times10^{-6}$ V/Pa. (J. Accoust. Soc. Am., Vol. 61, Suppl. No. 1, Spring 1977, Pages 17 and 18). However, it is desirable to surpass this level of sensitivity.

SUMMARY OF THE INVENTION

The above-stated disadvantages of the prior art are overcome by the present invention. In the present invention, it has been determined that the spatial spread of the detector elements cannot be chosed at will, because of the difficulty of attaching electrodes to the polymer foil. In addition the sensitivity can only be raised if every detecting element is equipped with an electronic amplyfying element, preferably a field effect transistor, which must be located in close proximity to the detector element. Connection to a relatively more distant amplifier loads down the detector element through the lead capacity $C_L$ which together with the capacity of the detector element $C_E$ and a detector element voltage of $U_E$ leads to a reduced voltage U in accordance with—

$$\frac{u}{u_E} = \frac{C_E}{C_E + C_L} \approx \frac{C_E}{C_L} \text{ for } C_E << C_L.$$

A coaxial cable for example has a lead capacity of about 1 pf/cm, so that, for example, with a 30 cm length, one obtains a reduction of $C_E/30$. On the other hand the impedance at the output of the amplifier has been transformed. One may then run connecting leads to further stages of the amplifier. If a large number of detector elements are employed in close proximity to each other, one must also arrange the related amplifiers in a similar array.

The invention therefore seeks to improve upon these known miniature hydrophones, and ideally to provide a hydrophone with which unknown ultrasonic fields of greater spread may be measured in shorter time periods and in a simpler way. In addition the usefulness and sensitivity are raised.

Another known ultrasonic transducer arrangement with multiple transducer elements for the detection of ultrasonic oscillations from a sound conducting medium teaches the use of a base element of polyvinylidene fluoride PVDF. This base element is provided on one of its sides with pre-arranged piezoelectrically active areas which respectively form one of the transducer elements and are respectively provided with an electrode of electrically conducting material. The foil is polarized in these areas only in the direction of its thickness and is positioned with its electrons on one side of the flat sides of a base element. This monolithic design of an ultrasonic transducer arrangement forms a broadband detector array having high sensitivity. (DE-OS 31 49 732).

The thickness of electrodes, which are preferably secured to the top surface of the support body, for example by evaporation, will not generally exceed a few $\mu$m and will preferably be less than 1 $\mu$m. Therefore the associated connecting conductors should essentially not exceed this thickness. They may be produced in a relatively simple way during the same procedure used to form the electrodes, for example, through a photolithographic process. It is however difficult to carry these conductors around a corner of the support body when these conductors are to be connected to electrical elements which are attached to an upper surface of the support which forms a corner with the top surface. The present invention, in this case, teaches that the surface of the top surface area which is near the corner of the upper surface may be provided with a groove, which is at right angles to the corner. Inside the groove at least a part of the top surface is metalized, the metalized surface facilitating the connection between the electrodes and the aforementioned electrical elements, for example, through soldering. (DE-OS 32 46 661).

The invention employs these known characteristics of form in an ultrasonic transducer arrangement. However, the present spread of the detector elements in the plane of the flat side of the base element is generally less than 1 mm and their separtation is limited to essentially no more than a tenth of 1 mm. Since the spread of the associated amplifiers, preferably hybrid amplifiers, does not exceed this value, a linear grid lay-out of less than 1 mm is achieved. The present hydrophone has a sensitivity of at least $10^{-5}$ V/Pa. Not more than a single shift at a right angle to the linear array of the detecting elements is thus required to measure an ultrasonic field. In a special embodiment of the hydrophone, the distance of the first and the last element from the proximal and distal end of the carrier will be approximately half the distance as measured between the individual detector elements. It is therefore possible in the present hydrophone to arrange a larger number of modules in series in the linear spread of the detector elements into a common modular unit with the same grid lay-out. With this embodiment, ultrasonic fields of larger expanse may be measured in shorter time periods.

Further advantageous features of the present hydrophone are demonstrated in the following detailed description of the drawings.

In order to understand the invention, reference should be made to the figures illustrating various embodiments of a hydrophone according to the invention.

DETAILED DESCRIPTION

Figure 1:
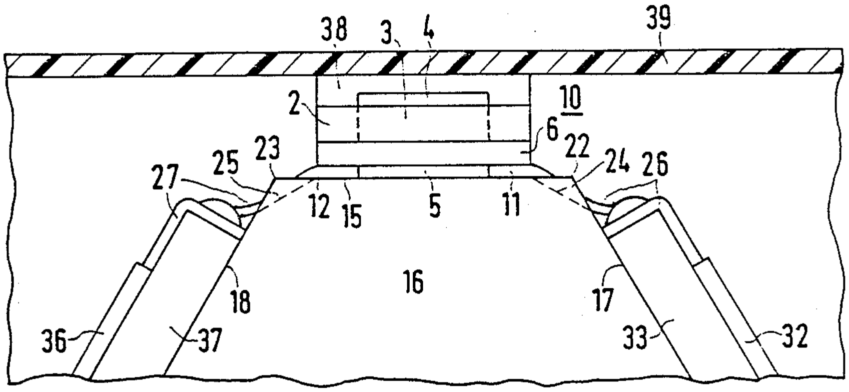
FIG. 1 shows a part of a side view of the present hydrophone.

In the design of FIG. 1, a detector element is constructed from the numbered piezoelectrically active areas 3 of a base element 2, to which is allocated an electrode 4 on its upper flat side and an electrode 5 on its lower flat side, the combination being fastened to a support body 16. The electrode 5 is capacitively coupled through a non-conducting bonding layer 6, having a high dielectric constant, to the piezoelectrically active area 3 of the base element 2. The lower electrode 5 adjacent to the linear arrangement of detectors is provided with an electric conducting lead wire 11. From a detector element, not shown, adjacent to a linear arrangement of individual detector elements 10, a connecting lead 12 is also visible. The top surface 15 of the support 16 is bordered on the side by two sloped side surfaces 17 and/or 18 which together with the top surface 15 form a corner 22 and/or 23. These corners 22 and/or 23 are provided with a groove 24 and/or 25 in the area of the connecting leads 11 and/or 12 which is directed at right angles to the corner 22 and/or 23 and whose inside top surface, not shown in FIG. 1, is respectively at least partly metalized. The metalization in the groove 24 serves, for example, as an electrical connection, preferably for soldering a connecting lead 26 for an amplifier 32 associated with one of the detector elements, which is provided on a substrate 33. A connecting lead 27 and an amplifier 36, allocated to a neighboring detector element 10, not shown, and similarly provided on a substrate 37, is visible in FIG. 1.

The base element 2 of the detector element 10 is comprised of a polymer foil, preferably polyvinylidene fluoride PVDF or possibly a co-polymer of vinylidene fluoride with a tetrafluorethylene or trifluorethylene having a thickness of about 25 μm which is polarized in its piezoelectric area 3, in the direction of its thickness. The associated electrodes 4 and 5 are made of metal, the thickness of which does not exceed a few μm and specifically may be less than 1 μm. An especially useful metal is chrome/silver but also chrome/gold may be used. The chromium layer, having a thickness of, for example, 20 μm serves as a bonding agent on which is then placed a silver or gold layer about 0.2 μm. The electrode 5 may suitably be applied by evaporation or sputtering with the connecting lead 11 on the support body 16 in a common process. The electrode 5, with the help of the bonding layer 6 which is made of an electrically insulating material having a higher dielectric constant and which may preferably be an adhesive, such as a layered cement application or putty, is indirectly attached to the base element 2. The support 16, or so-called backing, may preferably be made of a material of high acoustic impedance. In connection with this type of design, for example, the so-called hard backing may suitably be made of ceramic, preferably aluminum oxide $Al_2O_3$, the acoustic impedance of which is in the order of $40\times10^6$ Kg/m$^2$s. Additionally glass or quartz with an acoustic impedance of $14\times10^6$ Kg/m$^2$s. is also suitable. A soft backing may also be used for the support 16, which itself is capable of absorbing the ultrasonic sound and which may be made of rubber. A detected ultrasonic signal would then have a frequency range of from 1 to at least 10 Hz in the transducer element 10 and would be capacitatively coupled from the lower flat side of the active area 3 to electrode 5 and forwarded to the associated amplifier 32 over the connecting leads 11 and 26.

The amplifiers 32, 36 are suitably of a hybrid type and are placed on a substrate 33, 37 preferably a thin film substrate. These hybrid amplifiers 32, 36 have a heterogeneous construction. The resistors are preferably formed through thin film techniques while the associated transistors can, as transistor chips, be cemented on and bonded to their electrically conducting leads.

The detecting element 10 is coupled through the ultrasonic coupling medium 38 to the covering foil 39, which can, for example, consist of a polymer and serves as a closing wall on the front side of the chamber in which the indicated component is arranged.

Figure 2:
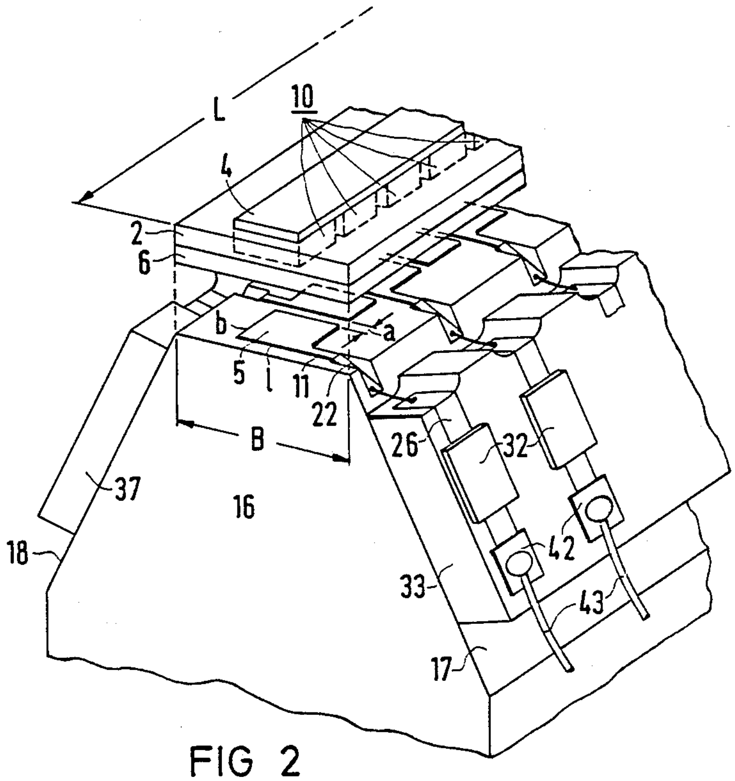
FIG. 2 shows a part of the hydrophone in perspective.

As shown in the perspective drawing of FIG. 2, for a multiplicity of detector elements 10 there is provided, on the upper flat side of the common base 2, a common electrode 4 for all detector elements. The base element 2 with the bonding layer 6 is, for clarity, intentionally shown separated from the lower electrode 5 which, in the linear direction of expansion, one of the modules, not shown in the FIGURE, is provided with, for example, 16 detector elements arranged one behind the other. As an example, in a length of $l=0.8$ mm and a width of $b=0.7$ mm and a separation of $a=0.1$ mm of the electrodes 5, one obtains an array size of 0.8 mm so that the total length L of the module comes to about 12 mm. Therewith, one obtains, at a frequency of, for example, 2 Mhz, a capacity $C_E$ of the detector elements 10 of about 1.6 pf.

In a particularly advantageous design of the hydrophone, the amplifiers 32 and/or 36 allocated to the detector elements 10 respectively can be alternately located on one of the side surfaces 17 and/or 18 of the support 16. The length of the electrical lead connection between electrode 5 and the associated amplifier 32, which is formed from the connecting leads 11 and 12, and which with the help of the metalization of the inside of the groove 22 are electrically connected together, is very short. The length may, for example, be only about 1 mm and, in addition, is the same for all detector elements 10. The sensitivity of the system consisting of the detector element 10 and amplifier 32 and/or 36 is therefore homogeneous and very high. With the low self capacitance of the hybrid amplifier of about 2 pf, and a high input impedance in the order of 100 KΩ, a 20 fold amplification and a small channel width of about 1.6 mm as well as a high band width of about 15 Mhz and a low noise of about 8 $nV/\sqrt{Hz}$, one obtains a sensitivity of about $10^{-5}$ V/Pa with a hydrophone with 16 detection transducers 10 and a base element 25 μm thick.

The amplifiers 32 with the help of the metalized areas 42 on the upper surface of the substrate 33 are provided with electrical signal leads which can lead to additional components of the amplifiers 32.

Figure 3:
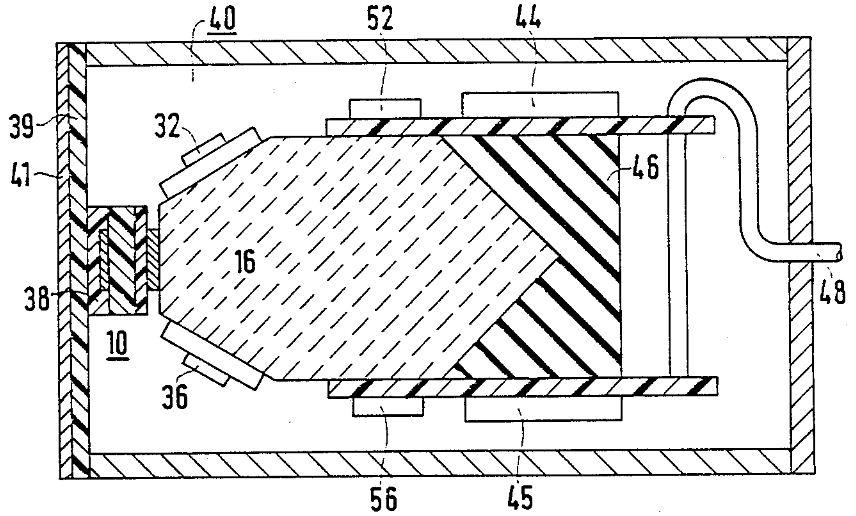
FIG. 3 shows a sectional view of the arrangement of a hydrophone with the associated electrical elements in a common chamber.

In the design of FIG. 3, a module with a multiplicity of detector elements 10 is arranged in a chamber, which is closed on its front side with the covering foil 39, and which is coupled through the ultrasonic coupling medium 38 to the detector element 10 which is located on the support 16. This support 16 consists of a hard backing on which the end opposite the detector element 10 has been provided with an absorber 46. The absorber 46, for example, may be an epoxy resin provided with additives that may, for example, be aluminum oxide powder. The end of the support 16 is formed to a point in order that the reflected component of any ultrasonic waves entering the support 16 from the common surface between the absorber 46 and the support 16 is minimized. The walls of the chamber 40 are generally made of metal. The covering foil 39 is made of a sturdy material that is non-porous to water. It may be, for example, made of polyethylene, polyurethane or polymide having a thickness of about 25 μm.

In an especially advantageous design of the hydrophone, the covering foil 39 is equipped with a metal layer 41 which serves as a shield. In addition to the detector element 10 and their associated amplifiers 32 and 36 whose electrical connecting leads are not shown in the interests of clarity, the chamber 40 can contain the components, for example, resistors and capacitors, normally associated with each row of amplifiers 32 to 36, which, in the interest of simplicity, are shown as the contruction element 52 and/or 56. These components 52 and 56 respectively are mounted on a printed circuit board, not further described, along with a common multiplexer 44 and/or 45 for all amplifiers 32 and/or 36, the output signals of which can be led off with a common signal conductor 48. The signal conductor 48 can be designed as a multi-conductor cable, which contains the power leads as well as the allocation information.

The ultrasonic coupling medium 38 is employed only to prevent the formation of an air layer between the detector elements 10 and the covering foil 39. This ultrasonic coupling medium 38 may suitably, for example, be a layer of water carrying gel or a silicone grease, the thickness of which will generally in the ideal not exceed a few μm and may typically be 5 μm.

Figure 4:
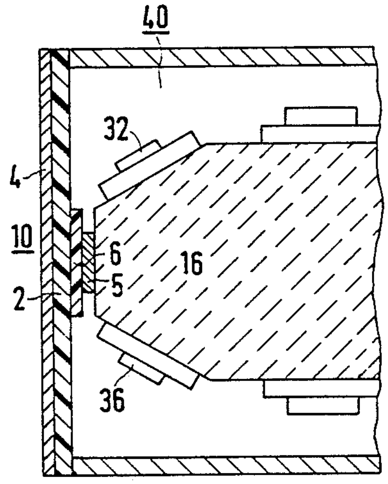
FIG. 4 shows a specific design form of the detector elements of the present hydrophone and their coupling to the covering foil of the chamber.

In the design of the hydrophone of FIG. 4, the base element 2 of the detector element 10 is employed as the covering foil for the chamber 40. At the same time, the bonding layer 6 forms an electrical coupling medium for the electrode 5 which is fastened to the support 16. In this design, the metalized cover 4 serves at the same time as ground electrode for the detector elements 10.

What is claimed is:

1. A hydrophone with a flat piezoelectric base element having a predetermined thickness, the hydrophone comprising a linear arrangement of detector elements with piezoelectric active areas with which are associated on both flat sides respectively a pattern of metallic electrodes, the electrodes having electrical connecting leads, the hydrophone characterized by:

the electrodes of one flat side of the base element located on a flat top surface of a mechanical support, the electrode, by means of a common electrically non-conducting coupling medium that serves as a bonding layer, being capacitively coupled to the associated active areas of the base element;

the detector elements being respectively associated with at least one amplifier, the amplifer being fastened with similar length lead wires to at least one flat surface of the support, the upper surface areas near the corners between the top flat surface and the side flat surfaces of the support being provided with a groove through the corners;

at least the top surface inside the groove being provided with a metalized coating, the groove for facilitating the electrical connection of the electrode of the associated detector element with the associated amplifier said detector elements being physically separated from said respectively associated at least one amplifier at a separation distance therebetween large compared with said predetermined thickness of said flat piezoelectric base element;

a chamber for containing the hydrophone, said chamber containing a power source as well as at least one multiplexer; and the front face of the chamber being closed with a covering foil the thickness of which is substantially less than the wavelength of the ultrasonic field to be measured.

2. A hydrophone in accordance with claim 1 further characterized in that an ultrasonic coupling medium is employed between the covering foil and the detector elements.

3. A hydrophone according to claim 1 further characterized in that the covering foil is provided with a shielding layer of electrically conducting material on the side away from the detecting elements.

4. A hydrophone according to claim 1 further characterized in that the base element of the detector elements is employed as the covering foil.

5. A hydropohone according to claim 4 further characterized in that the base element is provided with a metallic layer on the side facing away from the support which forms an electrode and is employed as a common ground electrode for the detector elements.

6. A hydrophone with a flat piezoelectric base element, the hydrophone comprising a linear arrangement of detector elements with piezoelectric active areas with which are associated on both flat sides respectively a pattern of metallic electrodes, the electrodes having electrical connecting leads, the hydrophone characterized by:

the electrodes of one flat side of the base element located on a flat top surface of a mechanical support, the electrode, by means of a common electrically non-conducting coupling medium that serves as a bonding layer, being capacitively coupled to the associated active areas of the base element, the detector elements being respectively associated with at least one amplifier, the amplifier being fastened with similar length lead wires to at least one flat surface of the support, the upper surface areas near the corners between the top flat surface and the side flat surfaces of the support being provided with a groove through the corners;

at least the top surface inside the groove being provided with a metalized coating, the groove for facilitating the electrical connection of the electrode of the associated detector element with the associated amplifier; a chamber for containing the hydrophone, the chamber containing a power source as well as at least one multiplexer; and the front face of the chamber is closed with a covering foil the thickness of which is substantially less than the wavelength of the ultrasonic field to be measured.

7. A hydrophone in accordance with claim 6 further characterized in that an ultrasonic coupling medium is employed between the covering foil and the detector elements.

8. A hydrophone according to claim 6 further characterized in that the covering foil is provided with a shielding layer of electrically conducting material on the side away from the detecting elements.

9. A hydrophone according to claim 6 further characterized in that the base element of the detector elements is employed as the covering foil.

10. A hydrophone according to claim 9 further characterized in that the base element is provided with a metallic layer on the side facing away from the support which forms an electrode and is employed as a common ground electrode for the detector elements.

* * * * *